United States Patent [19]

Singer et al.

[11] Patent Number: 4,939,566
[45] Date of Patent: Jul. 3, 1990

[54] SEMICONDUCTOR SWITCH WITH PARALLEL LDMOS AND LIGT

[75] Inventors: Barry M. Singer, New York City; Gert W. Bruning, Tuckahoe; Satyendranath Mukherjee, Yorktown Heights, all of N.Y.

[73] Assignee: North American Philips Corporation, New York, N.Y.

[21] Appl. No.: 115,478

[22] Filed: Oct. 30, 1987

[51] Int. Cl.⁵ ............................................. H01L 27/02
[52] U.S. Cl. ................................... 357/41; 357/23.4; 357/23.8; 357/86; 357/38
[58] Field of Search ..................... 357/23.4, 23.8, 41, 357/86, 38 T, 38, 15

[56] References Cited

U.S. PATENT DOCUMENTS

| 4,199,774 | 4/1980 | Plummer | 357/41 |
| 4,300,150 | 11/1981 | Colak | 357/23.4 |
| 4,618,872 | 10/1986 | Baliga | 357/23.4 |
| 4,694,313 | 9/1987 | Beasom | 357/23.4 |
| 4,712,124 | 12/1987 | Stupp | 357/23.4 |

FOREIGN PATENT DOCUMENTS

| 0111803 | 6/1984 | European Pat. Off. | |
| 0115098 | 8/1984 | European Pat. Off. | |
| 0146181 | 6/1985 | European Pat. Off. | |
| 0224269 | 6/1987 | European Pat. Off. | 357/23.8 |
| 0228107 | 7/1987 | European Pat. Off. | 357/23.8 |
| 5223277 | 2/1977 | Japan | 357/23.4 |

OTHER PUBLICATIONS

IEEE Transactions, vol. Ed. 33, No. 12, Dec. 1986, pp. 1956-1963, Pahanayak et al.

Primary Examiner—William Mintel
Attorney, Agent, or Firm—Robert T. Mayer

[57] ABSTRACT

A semiconductor switch comprising a lateral DMOS and a lateral IGT both of which can be fabricated in a monolithic integrated circuit. In operation the lateral DMOS stays on while the lateral IGT is switched off in order to reduce turn off power dissipation.

11 Claims, 2 Drawing Sheets

SEMICONDUCTOR SWITCH WITH PARALLEL LDMOS AND LIGT

This is an invention in the semiconductor art. More particularly it is an invention involving a semiconductor switch for power switching which can be readily fabricated in a monolithic integrated circuit.

Various types of power switching semiconductor devices are known. Included among these are hybrid devices in which two different device structures are fabricated on a single semiconductor chip. One such hybrid device which has been proposed in the past combines a power MOS transistor with a vertical insulated gate transistor. This combination is acceptable in a separate device but cannot be fabricated in a monolithic integrated circuit together with numerous other devices because the vertical insulated gate transistor uses the substrate as one of its contacts.

It is an object of this invention to provide a semiconductor switch which can be fabricated as part of a monolithic integrated circuit.

One of the features of the invention is the use of a lateral insulated gate transistor in a parallel circuit with a lateral DMOS transistor for primarily inductive switching operations. This provides one of the advantages of the invention. By using a lateral insulated gate transistor, its area efficiency is obtained and by connecting it in parallel with a relatively small lateral DMOS for turnoff operation a fast switch is obtained which takes up less than one-fifth the silicon area which a DMOS of comparable capacity would occupy.

Another advantage of the invention is the low power dissipation during turn off compared to a lateral insulated gate transistor alone.

In accordance with the invention there is provided a semiconductor switch including a lateral double diffused MOS transistor capable of transferring between a current conducting state and a nonconducting state. The transistor has a first gate, a source region and a drain region. A lateral insulated gate transistor capable of transferring between a current conducting state and a nonconducting state is also provided. This transistor has a second gate, a cathode region and an anode region. The source region and the cathode region are interconnected as are the drain region and the anode region. The first gate is connected to a signal means capable of generating signals for causing the lateral insulated gate transistor to transfer between its current conducting state and its nonconducting state. Delay means are connected to the second gate. The delay means are capable of generating signals to cause the lateral doubled diffused MOS transistor to transfer between its current conducting state and its nonconducting state. The delay means are responsive to a signal from the signal means which causes the lateral insulated gate transistor to transfer to its nonconducting state and to the current conducted by the lateral insulated gate transistor to generate a signal to transfer the lateral double diffused MOS from its conducting state to its nonconducting state.

In accordance with another aspect of the invention, there is provided a semiconductor device comprising a semiconductor substrate of a first conductivity type having a major surface. An epitaxial layer of a second conductivity type opposite to that of the first conductivity type is on the substrate forming part of the major surface. A major surface adjoining first channel region of the first conductivity type is in the epitaxial layer. A major surface adjoining drain region of the second conductivity type is also in the epitaxial layer spaced from the first channel region. A major surface adjoining source region of the second conductivity type is located in the first channel region. The first channel region together with the source region and the drain region form a lateral double diffused MOS transistor. The device also includes a major surface adjoining anode region of the first conductivity type in the epitaxial layer adjacent the drain region. A major surface-adjoining second channel region of the first conductivity type is also in the epitaxial layer spaced from the anode region. A major surface-adjoining cathode region of the second conductivity type is located in the second channel region. The anode region, the cathode region and the second channel region form a lateral insulated gate transistor.

In accordance with a further aspect of the invention there is provided a semiconductor device having a major surface comprising a semiconductor substrate of a first conductivity type. An epitaxial layer of a second conductivity type opposite to that of the first conductivity type is on the substrate forming part of the major surface. A major surface adjoining source region of the second conductivity type is also included. A major surface adjoining drain region of said second conductivity type is in the epitaxial layer. A major surface adjoining first channel region of the first conductivity type is located between the source region and the drain region. The first channel region together with the source region and the drain region form a lateral double diffused MOS transistor. A major surface adjoining cathode region of the second conductivity type is also included. A major surface-adjoining anode region of the first conductivity type is in the epitaxial layer. A major surface-adjoining second channel region of the first conductivity type is located between the anode and the cathode regions. The anode and cathode regions and the second channel region form a lateral insulated gate transistor. The source region is in the first channel region. The cathode region is in the second channel region. The second channel region extends down to the substrate for isolating purposes except in a small section of the device where the epitaxial region isolates the second channel region from the substrate. The second channel region in the small section isolates the cathode region in the small section from the cathode region in the rest of the device. The channel region in the small section is separated from the channel region in the rest of the device by the epitaxial region.

Other objects, features and advantages of the invention will be apparent to those skilled in the art from the following description when considered in conjunction with the appended claims and the accompanying drawing in which:

Figure 1:
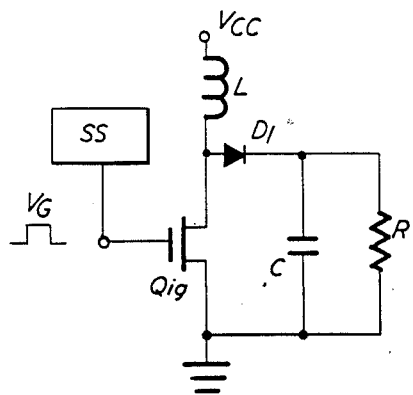
FIG. 1 is a diagram of an inductive circuit with a lateral insulated gate transistor.

In the drawing, equivalent elements are identified by the same reference characters. Also FIGS. 5, 6 and 7, it is to be understood, are not to scale.

Referring specifically to FIG. 1 there is shown a lateral insulated gate transistor Qig. In circuit with transistor Qig is an inductance L, rectifier Dl, capacitance C and a load represented by resistor R. Such a circuit is intended to be representative of the input of a ballast lighting circuit. Voltage $V_{cc}$ is the operating voltage for the circuit. A signal source SS is connected to the gate of transistor Qig to apply a gate signal $V_G$ thereto.

When gate voltage $V_G$ is applied to the gate of transistor Qig the voltage $V_{Qig}$ across transistor Qig drops substantially while the current to ground $I_{Qig}$ increases in a linear fashion. As can be seen from FIG. 2, when gate voltage $V_G$ is removed inductance L causes the current to remain high for a significant period of time whereas the voltage $V_{Qig}$ across transistor Qig rises significantly. As a consequence both the current through the transistor and the voltage across it during turn off are high for some time thereby providing a significant power dissipation during this period. This limits the efficiency of the device.

Figure 3:
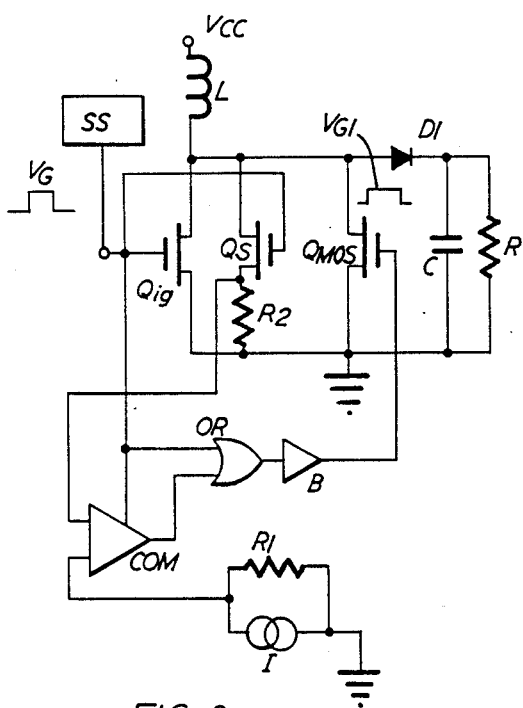
FIG. 3 is a diagram of an inductive circuit with a lateral insulated gate transistor in parallel with a lateral double diffused MOS transistor.

In order to provide a more efficient switching device than that shown in FIG. 1, the circuitry of FIG. 3 is disclosed herein. The same inductive circuit as in FIG. 1 with its inductance L, capacitance C, rectifier Dl, and load represented by resistor R is controlled by lateral insulated gate transistor Qig. In addition, a lateral double diffused MOS transistor QMOS is connected in parallel with the conducting path of transistor Qig. In this respect, the anode region of transistor Qig is connected to the drain region of transistor QMOS. The cathode region of transistor Qig is connected to ground to which the source region of transistor QMOS is also connected.

Also connected in the circuit of FIG. 3, is current source I with resistor R1 connected in parallel forming a reference signal source. The output of current source I is connected to one input of comparator COM. The other input of comparator COM is connected to a tap between resistor R2 and the series connected source of sensing transistor Qs. The gate of sensing transistor Qs is connected to the gate of transistor Qig and its drain is connected to the anode of transistor Qig. The gates of transistors Qig and Qs are also connected to signal source means SS. The source of sensing transistor Qs is connected to ground via resistor R2.

The enable input of comparator COM is connected to the gate of transistor Qig. The output of comparator COM is connected to one input of "or" gate OR. The other input of the "or" gate is connected to the gate of transistor Qig. The output of "or" gate OR is connected to the input of buffer B whose output is connected to the gate of LDMOS transistor QMOS.

As long as a gate voltage $V_G$ is applied to the gate of lateral transistor Qig by signal source means SS, comparator COM is disabled. When the gate voltage $V_G$ is removed comparator COM is enabled. This comparator functions to compare the current through transistor as with that from the reference signal source. As will be explained, because of its structure, the current through transistor Qs is indicative of the current through transistor Qig. As long as the current through transistor Qs is larger than the reference provided by current source I, "or" gate OR produces an output because it has an input either from gate voltage $V_G$ or from comparator COM. As a consequence buffer B provides a gate voltage $V_{GI}$ to the gate of transistor QMOS to maintain it in the on condition.

Figure 2:
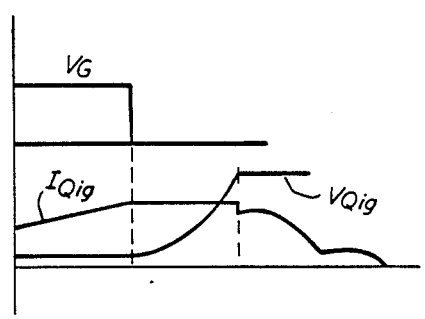
FIG. 2 is a graph of some voltages applied to the circuit of FIG. 1 and a resulting current therein.
Figure 4:
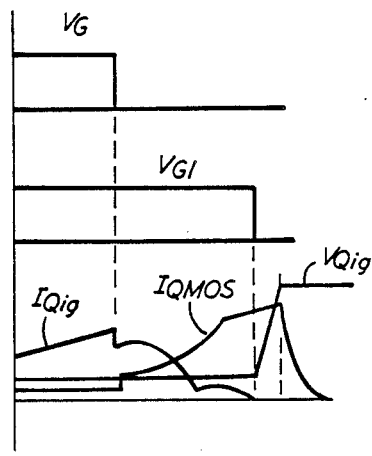
FIG. 4 is a graph of some voltages applied to the circuit of FIG. 3 and some resulting currents therein.

When gate voltage $V_G$ is removed from transistor Qig voltage $V_{Qig}$ across the transistor cannot rise as in the circuit of FIG. 1 because during this period transistor QMOS is on. This condition continues as long as the signal from sensing transistor Qs is larger than the reference signal from current source I. This is illustrated in FIG. 4 where voltage $V_{Qig}$ is shown to remain low at the removal of gate voltage $V_G$ and not to rise as in the case of the circuit of FIG. 1, as shown in FIG. 2. At the same time there is an increase in the current $I_{QMOS}$ through transistor QMOS but as shown in FIG. 4 the power loss is not significant since the voltage $V_{Qig}$ remains low.

When the current through transistor $Q_s$ falls to the reference set by current source I both inputs to comparator COM become equal and it ceases to produce an output. As a consequence both inputs to "or" gate OR are zero and it ceases to produce an output. The gate voltage $V_{GI}$ to transistor QMOS goes to zero and the transistor shuts off. As can be seen from FIG. 4 when this occurs the voltage $V_{Qig}$ across transistor Qig goes to its maximum but by this time there is little or no current through transistor Qig and transistor Qs. Moreover, that current through transistor QMOS rapidly falls to zero. With the arrangement of FIG. 3, significantly less loss occurs during turn off than with the circuit of FIG. 1. Moreover, because the losses in lateral DMOS transistor QMOS are small, it can be relatively small compared to a DMOS transistor of the same capacity as the combined lateral insulated gate transistor and the lateral DMOS transistor of this invention.

Figure 5:
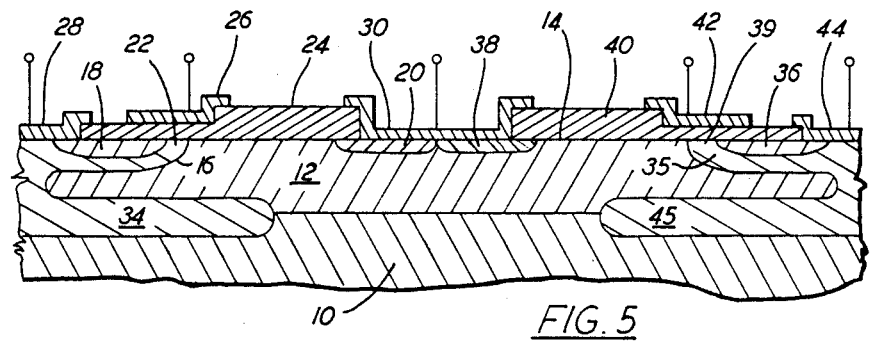
FIG. 5 is a schematic, partial cross-sectional view of a semiconductor structure in accordance with the invention.

It is contemplated that the circuitry shown in FIG. 3 except for inductance L could all be placed in a monolithic integrated circuit. FIG. 5 shows a representative structure for transistors Qig and QMOS as they would appear in such a monolithic integrated circuit.

Shown in FIG. 5 is a semiconductor substrate 10 of a first conductivity type, typically p-type, with an epitaxial surface layer 12 of a second conductivity type opposite to that of the first, typically n-type. The epitaxial layer is provided on the top surface of substrate 10 and provides part of a major surface 17. A major surface adjoining first channel region 16 of a first conductivity type is provided in the epitaxial layer and forms a p-n junction therewith. A major surface adjoining source region 18 of the second conductivity type is provided in first channel region 16. A major surface adjoining drain region 20 also of the second conductivity type is provided in the epitaxial layer at a location which is spaced apart from first channel region 16. First channel region 16 has a surface adjoining portion 22 located between the source and drain regions of the device which forms a channel of a lateral DMOS transistor. An insulating layer 24 is provided on the epitaxial surface layer 12 and covers at least that portion of the first channel region 16 located between the source and drain regions of the transistor. A gate electrode 26 is provided on the insulating layer over channel 22. Source electrode 28 and drain electrode 30 provide electrical connections respectively to the source and drain regions of the transistor.

Buried layer 34 extends beneath first channel region 16 and part of epitaxial layer 12 between source and drain regions 18 and 20. Buried layer 34 extends across the entire area below gate electrode 26 and stops shortly thereafter. First channel region 16 and buried layer 34 extend down to substrate 10 to provide isolation. If the foregoing were all that was fabricated in the monolithic integrated circuit one would have a well known DMOS transistor, similar to that disclosed in U.S. Pat. No. 4,300,150.

However, in accordance with the invention an additional surface adjoining second channel region 35 of the first conductivity type is provided in epitaxial layer 12. A further surface adjoining cathode region 36 of the second conductivity type is provided in second channel region 35. This forms the cathode region of a further to be described lateral insulated gate transistor. A surface adjoining anode region 38 of the first conductivity type is provided in the epitaxial layer at a location which is spaced apart from second channel region 35. Second channel region 35 has a surface adjoining portion 39 located between cathode region 36 and anode region 38 which forms a channel for the lateral insulated gate transistor. An insulating layer 40 is provided on the surface of epitaxial layer 12 and covers at least that portion of second channel region 35 located between anode and cathode regions 36 and 38 of this lateral insulated gate transistor.

As will be understood by those skilled in the art, a gate electrode 42 is provided on insulating layer 40 over second channel 35. The anode 38 of the lateral insulated gate transistor is connected to the drain region 20 of the lateral DMOS transistor by having common electrode 30 provide electrical connections to both. Cathode electrode 44 contacts both cathode region 36 and second channel region 35 providing a conventional cathode short therebetween. P-type buried region 45 is provided under channel region 35 and between the cathode and anode regions. As is shown, buried layer 45 will typically extend across the entire area below the gate electrode and stop shortly thereafter. This buried layer provides field shaping for the lateral insulated gate transistor. Second channel region 35 and buried layer 45 extend down to substrate 10 to provide isolation.

As those skilled in the art will understand the device shown in FIG. 5 can be fabricated by well known techniques and will vary physically in accordance with the operating specifications desired for a particular application. For this reason, no material or physical specifications have been included in order not to complicate the description. As stated earlier it is further contemplated that a monolithic integrated circuit of which the disclosed lateral DMOS transistor and lateral insulated gate transistor can form a part could also include the components shown in FIG. 3 including resistors R, R1 and R2, capacitor C, comparator COM, diode D1, "or" circuit OR, buffer B and current source I. All of these would also be fabricated by standard techniques.

Figure 6:
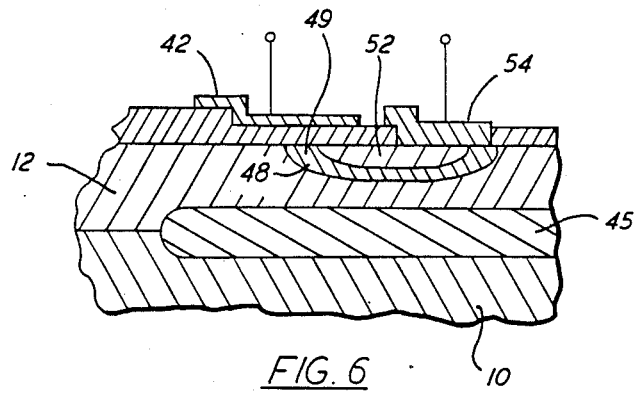
FIG. 6 is a schematic, partial cross-sectional view of part of the structure of FIG. 5 with some changes in that structure.
Figure 7:
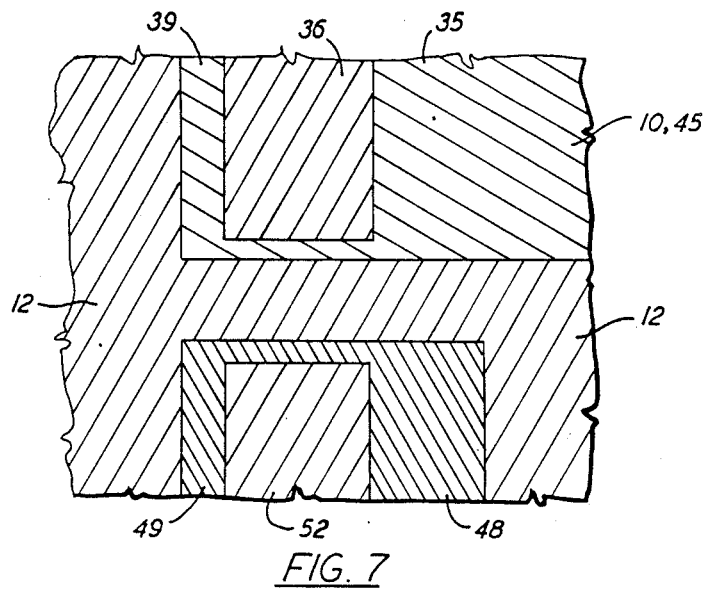
FIG. 7 is a layout of part of the structure shown in FIGS. 5 and 6.

FIGS. 6 and 7 show the manner in which transistor Qs is fabricated in the monolithic integrated circuit. A small section of the circuit is reserved for this purpose. Auxiliary channel region 48 and its surface adjoining portion 49 in this small section is separated from second channel region 35 and its surface adjoining portion 39 in the rest of the structure by n-type epitaxial region 12. Epitaxial region 12 also isolates auxiliary channel region 48 from p-type regions 45 and 10 in this small section. Gate contact 42 (FIGS. 5 and 6), however, is common for both channel region 35 and channel region 48. In addition, cathode region 52 in this small section is separated from cathode region 36 in transistor Qig and is isolated by channel region 48. Also contact 54 (FIG. 6) is provided for cathode region 52 in this section. Contact 54 it is to be understood is separate from contact 44 (FIG. 5) which contacts cathode region 36 in that part of transistor Qig not comprising transistor Qs. In this way resistor R2 can be connected between cathode contact 54 of transistor Qs and cathode contact 44 of transistor Qig as shown in FIG. 3. Since transistor Qs is part of the same structure as transistor Qig it is to be understood that it conducts a current which is indicative of the current through transistor Qig.

It is apparent that various modifications of the above will be evident to those skilled in the art and that the arrangement described herein is for illustrative purposes and is not to be considered restrictive.

What is claimed is:

1. A semiconductor device having a major surface comprising a semiconductor substrate of a first conductivity type, an epitaxial layer of a second conductivity type opposite to that of the first conductivity type on said substrate forming part of said major surface, a major surface-adjoining source region of said second conductivity type, a major surface-adjoining drain region of said second conductivity type, a major surface-adjoining first channel region of said first conductivity type located between said source region and said drain region which together with said source region and said drain region forms a lateral double diffused MOS transistor, a major surface-adjoining cathode region of said second conductivity type, a major surface-adjoining anode region of said first conductivity type, a major surface-adjoining second channel region of said first conductivity type located between said anode and said cathode regions, said anode and cathode regions and said second channel region forming a lateral insulated gate transistor, said drain region and said anode region being in electrical contact with each other, wherein said source region is in said first channel region and said drain region is in said epitaxial layer and wherein said cathode region is in said second channel region and said anode region is in said epitaxial layer.

2. A semiconductor device having a major surface comprising a semiconductor substrate of a first conductivity type, an epitaxial layer of a second conductivity type opposite to that of the first conductivity type on said substrate forming part of said major surface, a major surface-adjoining source region of said second conductivity-type, a major surface-adjoining drain region of said second conductivity type, a major surface-adjoining first channel region of said first conductivity type located between said source region and said drain region forms a lateral double diffused MOS transistor, a major surface-adjoining cathode region of said second conductivity type, a major surface-adjoining anode region of said first conductivity type, a major surface-adjoining second channel region of said first conductivity type located between said anode and said cathode regions, said anode and cathode regions and said second channel region forming a lateral insulated gate transistor, said source region being in said first channel region and said drain region being in said epitaxial layer, said cathode region being in said second channel region and said anode region being in said epitaxial layer and wherein said second channel region extends down to said substrate for isolating purpose except in a small section of said device wherein said epitaxial layer isolates an auxiliary channel region from said substrate, said auxiliary channel region in said small section isolating a cathode region in said small section from said cathode region in the rest of said device, said auxiliary channel region in said small section being separated from said second channel region in the rest of said device by said epitaxial layer.

3. A semiconductor device having a major surface comprising a semiconductor substrate of a first conductivity type, an epitaxial layer of a second conductivity type opposite to that of the first conductivity type on said substrate forming part of said major surface, a major surface adjoining cathode region of said second conductivity type, a major surface-adjoining anode region of said first conductivity type, a major surface-adjoining channel region of said first conductivity type located between said anode and said cathode regions, said anode and cathode regions and said channel region forming a lateral insulated gate transistor, said cathode region being in said channel region and said anode region being in said epitaxial layer and wherein said channel region extends down to said substrate for isolating purposes except in a small section of said device wherein said epitaxial layer isolates an auxiliary channel region from said substrate, said auxiliary channel region in said small section isolating said cathode region in said small section from said cathode region in the rest of said device, said auxiliary channel region in said small section being separated from said channel region in the rest of said device by said epitaxial layer.

4. A semiconductor device as claimed in claim 1, wherein said anode region and said drain region adjoin each other in said epitaxial layer.

5. A semiconductor device as claimed in claim 2, wherein said drain region and said anode region are in electrical contact with each other.

6. A semiconductor device as claimed in claim 5, wherein said anode region and said drain region adjoin each other in said epitaxial layer.

7. A semiconductor device as claimed in claim 2, wherein there is an anode region in said small section which is the same as the anode region in the rest of the device.

8. A semiconductor device as claimed in claim 3, wherein there is an anode region in said small section which is the same as the anode region in the rest of the device.

9. A semiconductor device as claimed in claim 4, wherein there is an anode region in said small section which is the same as the anode region in the rest of the device.

10. A semiconductor device as claimed in claim 5, wherein there is an anode region in said small section which is the same as the anode region in the rest of the device.

11. A semiconductor device as claimed in claim 6, wherein there is an anode region in said small section which is the same as the anode region in the rest of the device.

* * * * *